United States Patent [19]

Juskey et al.

[11] Patent Number: 5,232,758

[45] Date of Patent: Aug. 3, 1993

[54] NON-HARDENING SOLVENT REMOVABLE HYDROPHOBIC CONFORMAL COATINGS

[75] Inventors: Frank J. Juskey; Anthony B. Suppelsa, both of Coral Springs; Kenneth M. Wasko, Boca Raton, all of Fla.

[73] Assignee: Motorola, Inc., Schaumburg, Ill.

[21] Appl. No.: 577,387

[22] Filed: Sep. 4, 1990

[51] Int. Cl.⁵ .............................................. B32B 1/04
[52] U.S. Cl. ........................................ 428/76; 29/841; 29/846; 106/14.34; 106/14.38; 106/14.45; 427/96; 427/154; 427/155; 428/201; 428/203; 428/901
[58] Field of Search ................. 29/841, 846; 427/154, 427/155, 96; 428/76, 201, 203, 901; 106/14.38, 14.43, 14.34; 524/162; 357/72; 252/33, 358, 388, 395

[56] References Cited

U.S. PATENT DOCUMENTS

| | | | |
|---|---|---|---|
| 3,565,843 | 2/1971 | Kassinger | 106/14.38 |
| 3,819,394 | 6/1974 | Schnebel | 427/155 |
| 4,490,496 | 12/1984 | Maekawa | 524/433 |
| 4,592,783 | 6/1986 | Dressler | 106/14.38 |
| 4,632,848 | 12/1986 | Gosset | 427/154 |
| 4,635,356 | 1/1987 | Ohuchi et al. | 29/841 |
| 4,675,215 | 6/1987 | Ciuba | 106/14.23 |
| 4,729,791 | 3/1988 | Laura | 106/14.38 |
| 4,768,286 | 9/1988 | Ketcham | 29/841 |
| 4,830,922 | 5/1989 | Sparrowhawk | 427/154 |
| 4,842,903 | 6/1989 | Hayner | 106/14.43 |
| 4,890,383 | 1/1990 | Lumbard et al. | 29/841 |
| 4,927,667 | 5/1990 | Shih | 427/154 |

OTHER PUBLICATIONS

Eisenmann, "Removable Encapsulation for Modules or Cards", IBM Tech. Disc. Bull., vol. 13, No. 8 (Jan. 1971), p. 2459.

*Primary Examiner*—George F. Lesmes
*Assistant Examiner*—Nasser Ahmad
*Attorney, Agent, or Firm*—Dale W. Dorinski

[57] ABSTRACT

A non-hardening, solvent removable hydrophobic conformal coating is provided for electronic devices, such as printed circuit boards. The coating material comprises a metal alkyl benzyl sulfonate, together with a carrier and a solvent. The metal alkyl benzyl sulfonate may include compounds such as calcium eicosanylbenzyl sulfonate. The carrier may be any oxidized hydrocarbon, such as lauryl ethanoxylate, for example, and the solvent may be any low boiling aliphatic hydrocarbon. Though the coating is impervious to water, it may be readily and selectively removed using a small quantity of a non-polar organic solvent, such as mineral spirits or terpenes. Thus, although the electronic device is protected from corrosion, electromigration and physical harm by the coating, the coating may be easily, quickly and selectively removed in the event a component needs replacement, repair or adjustment.

16 Claims, 1 Drawing Sheet

NON-HARDENING SOLVENT REMOVABLE HYDROPHOBIC CONFORMAL COATINGS

FIELD OF THE INVENTION

The invention relates to structures for protecting electronic components, and in one aspect, more particularly relates to protective coatings conformal to the electronic components.

BACKGROUND OF THE INVENTION

It has long been known that electronic components assembled into a piece of electronic equipment are susceptible to damage of a number of forms. Physical impact, contact with dust, invasion by water causing corrosion, etc. are all well-known mechanisms by which an electronic circuit may be damaged. It is also known to coat an electronic component or a structure containing many components with a conformal coating of a protective material to guard the component from damage. Typically, these coatings are polymers that are applied to the component, such as a printed circuit board (PCB) for example, by any of a number of processes, including, but not limited to, spraying, layering, dipping, etc. The coating sets up by heating, such as in the case of a thermoset polymer; by reaction of various components, as in the case of an epoxy resin or polyurethane coating; or by the evaporation of a carrier or component, as in the case of a silicone or acrylic polymer.

Once cured, the coating is an intractable solid. The inertness of the coating is desired, of course, to protect the components. However, in the case of complex and/or costly components, it is often desired to fix or replace one or more of the components on an assembly in the case of component failure; component replacement, as in the case of an upgrade of the system; or to make some other engineering modification. This situation frequently happens in the case of PCBs which are assembled with a large number of components, particularly integrated circuits (ICs). The assembled PCB may be valued at hundreds or thousands of dollars. However, the conventional protective coatings work so well that it is very difficult to remove them to make the desired change in the board or component. If it is at all possible to remove the protective coating once in place, it may be accomplished only with hazardous chemicals or processes. Often, even if coating removal is achieved, the PCB and its components may be damaged additionally in the process. Further, these coatings cannot be removed selectively, that is, the entire coating must be removed even if a change is required in only a small part of the board. This characteristic of coating removal subjects the entire board to the possibility of damage, not just during coating removal, but also during the repair or engineering change process since the remainder of the board is exposed.

There is a need in the electronics industry for a protective, conformal coating over electronic components which may be selectively removed to facilitate changes or corrections in the components.

SUMMARY OF THE INVENTION

Accordingly, it is an object of the present invention to provide an electronic device or structure having a plurality of components thereon covered with a protective, conformal coating that may be selectively removed.

It is another object of the present invention to provide a process for giving electronic devices a protective, conformal coating quickly and easily.

It is yet another object of the invention to provide a protective, conformal coating for electronic devices that be selectively removed quickly and easily.

In carrying out these and other objects of the invention, there is provided, in one form, a coated electronic device having an electronic device with a plurality of components; and a water resistant coating over the electronic device covering the plurality of components in a conformal fashion. The water resistant coating may be selectively removed with a degreaser solvent to uncover at least one of the components.

Figure 1:
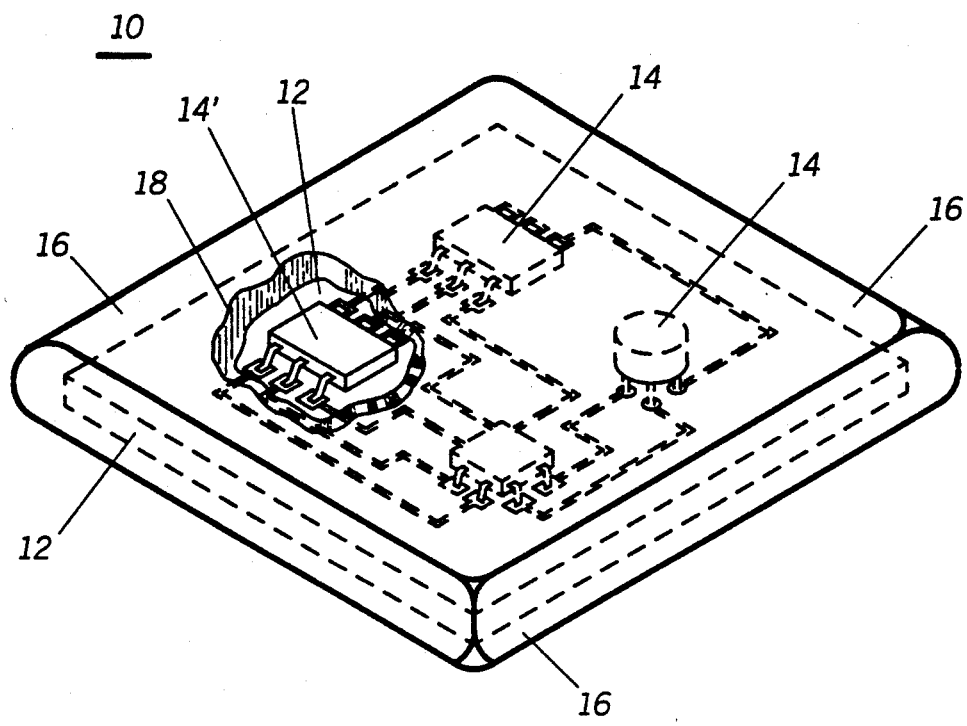
FIG. 1 is a three-quarters view of a printed circuit board structure covered with a conformal coating of the present invention, with part of the coating selectively removed to expose a single component for repair or replacement.

It should be noted that the drawing is not to scale; in particular, the thicknesses of the various components and the coating layer have been exaggerated for illustrative purposes.

DETAILED DESCRIPTION OF THE INVENTION

It has been discovered that a blend of a metal alkyl benzyl sulfonate and an oxidized hydrocarbon may be applied to an electronic device to conformally coat and encapsulate the device such that a hydrophobic surface is presented to the environment. This environmental barrier prevents surface permeation by moisture, thus preventing corrosion and electromigration of conductive surfaces. The coating has even demonstrated a resistance to moisture penetration when totally immersed in water.

The coating has a consistency similar to wax at room temperature. The mixture is soluble in mineral spirits and other similar non-polar degreaser solvents, such as the terpenes, naphtha, trichlorotrifluoroethane, methylene chloride, trichloroethane, xylene, hexane, with equivalent solvent powers. The coating, depending upon the solids loading, can be applied by spraying, dipping curtain coating, brushing, foaming, and the like. In a high solids solution, the material has the appearance of a dark amber viscous liquid with a distinctive petroleum odor.

The material is a blend, not a copolymer, of a metal alkyl benzyl sulfonate with various oxidized hydrocarbons. The benzyl group may be substituted, such as with halogens, e.g. chloro-, or alkyl groups besides the relatively long-chain alkyl groups, e.g. short-chain groups, such as methyl or isopropyl. The relatively long-chain alkyl group may have from about 10 to about 24 carbon atoms, and may include undecane ($C_{11}$), pentadecane ($C_{15}$) and eicosane ($C_{20}$) and the like. The metal cation may include barium (Ba), calcium (Ca), magnesium (Mg), and beryllium (Be), (Group IIA metals) molybdenum (Mo), and the like.

In one embodiment, the metal alkyl benzyl sulfonate may have the structure:

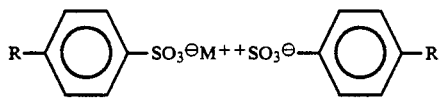

where M is Ca, Ba, Mg, Be or Mo, and R is an alkyl group of from 10 to 24 carbon atoms. In another embodiment of the invention, the metal alkyl benzyl sulfonate has the formula:

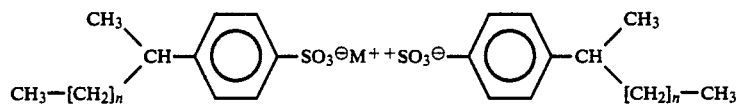

where M is as above and n ranges from 10 to 20. The use of high molecular weights and the divalent metals in an oxidized hydrocarbon makes them "waxy". The divalent metal bonds two sulfonate terminals, making the entire group insoluble in water.

The oxidized hydrocarbon is employed as a carrier in the blend and acts as a leveller. After application to the electronic component, it remains behind long enough to level out any bubbles and the like that may be present in the coating. The oxidized hydrocarbon carrier may include, but is not limited to materials such as: alkoxylated long-chain paraffins, such as alkoxylated lauryl, olenyl, linolenyl and the like. Preferably, the long-chain paraffins have from about 10 to about 20 carbon atoms. They may be alkoxylated with methyl, ethyl, propyl, butyl groups and the like. Specific examples of suitable oxidized hydrocarbon carriers include, but are not limited to lauryl ethanoxylate, olenyl ethanoxylate, olenyl methoxylate, linolenyl ethanoxylate, and the like. In one embodiment, the oxidized hydrocarbon carrier has at least one alkoxy group; in another embodiment, the carrier has only one alkoxy group.

Also present in the blend is a volatile solvent which permits the blend to be easily applied, but which quickly boils off. The solvent may be any low boiling aliphatic hydrocarbon, such as propane, butane, turpentine materials, hexane, naphtha, petroleum (pet) ether and the like. More specifically, it may be any alkane having from 3 to 8 carbon atoms and which readily volatilizes at room temperature (25° C.) or has a boiling point of about 80° C. or below.

A major improvement over conventional coatings for electronic devices is the ease with which this coating can be applied or removed. The coating may be easily applied by spraying, dipping, brushing or other technique, and can be removed almost instantly with a degreaser solvent. The degreaser may be any non-polar organic solvent, including, but not necessarily limited to, mineral spirits, terpenes, naphtha, trichlorotrifluoroethane, methylene chloride, trichloroethane, xylene, hexane, with equivalent solvent powers and the like. The solvent may be, but is not required to be, the same solvent as that used with the initial blend when the coating material is applied. Most conformal coatings which produce the same degree of environmental protection are non-removable, or require hazardous processes or chemicals for coating removal. Conformal coatings currently available consist mainly of thermoset polymers such as epoxies, silicones, polyurethanes and acrylics. Thermoset materials are not as environmentally stable as the thermoplastic-type coatings, since they are not as hydrophobic, and they are not easily removable.

A second major attribute of this coating is that it possesses an extremely long shelf life. The only requirement to maintain shelf life is to maintain solids level by solvent replenishment. The coating is considered non-hazardous according to OSHA definitions.

Coatings such as the ones described here are known in the marine industry to prevent salt water corrosion of metal parts, including the battery and ignition wires on boats.

The invention will be described in more detail with reference to the accompanying drawing Figures. Shown in FIG. 1 is a coated electronic device 10 having an electronic device 12, in this case a printed circuit board, with a plurality of components 14 mounted thereon. It will be appreciated that the PCB 12 is extremely simplified for clarity of illustration, and does not represent any particular circuit. The components 14 may be any sub-part of the electronic device 12 and are not limited to any certain type. For example, components 14 could be integrated circuits (ICs); discrete devices such as switches, capacitors, resistors, transistors, rheostats; input devices; output devices; inductors; coils; transformers and the like.

Conformally covering the electronic device 12 is a water resistant coating 16 of the present invention. The coating 16 may be selectively removed to form an opening 18 to expose a particular electronic component 14' for repair, replacement, resetting, etc. by using of one of the suitable solvents. After service or replacement, the opening 18 may be resealed with an appropriate portion of the coating 16 material. To ensure compatibility, it is preferred that the replacement coating 16 be the same as that used originally.

Figure 2:
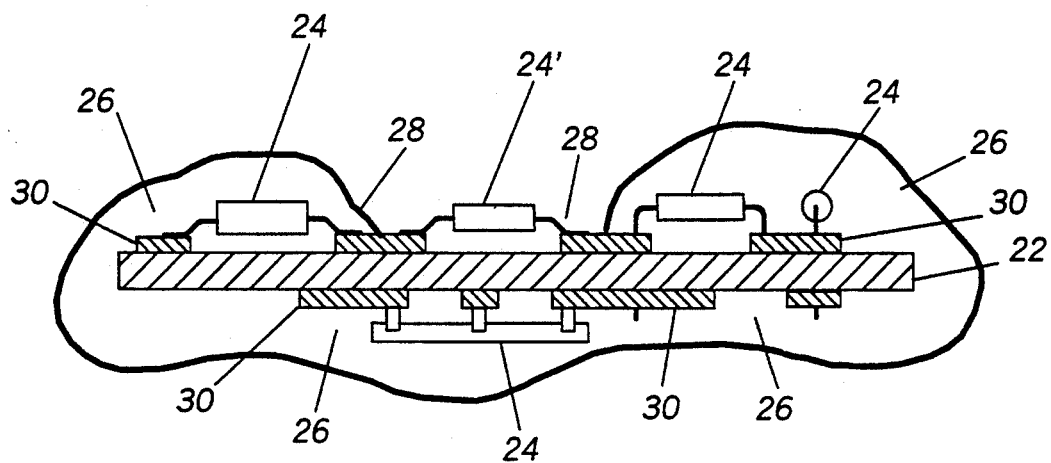
FIG. 2 is a side section view of a PCB encapsulated with a conformal coating of the invention having a portion of the coating removed to expose a single component.

Further, the water resistant coating 16 is very thin, relatively more thin than that depicted in FIGS. 1 and 2, on the order of about 0.5 to about 2.0 mil. Indeed, it is possible to solder through the coating 16, instead of removing it. Of course, the coating 16 would have to be reapplied around the new, added component. This soldering-through process cannot be done with an epoxy, silicone or urethane coating.

Shown in FIG. 2 is a sectional, edge view of another coated electronic device 20 where the electronic device 22 is again a PCB, in particular a double-sided PCB, bearing a plurality of electronic components 24 bonded to a system of electrically conductive traces 30. The conformal nature of the coating 26 is more clearly revealed in FIG. 2. By conformal is meant that the coating 26 conforms to the surface of the electronic device 22 and flows over it, under it and around it, roughly mimicking its contours, indeed, encapsulating it. The conformal property of the coating 26 is important in sealing the device 22 from invasion by water and other potentially harmful agents, as well as physical impact. An opening 28 in coating 26 exposing component 24' is also clearly illustrated in FIG. 2.

It will be appreciated that the electronic device need not take the form of an assembled PCB. It may include other electronic devices, such as controllers that are exposed to the weather, but which bear switches that must be changed from time to time or other components that may need repair or replacing. Relatively heavy duty electric or power devices are not contemplated as falling within the definition of electronic device which is meant to accommodate relatively complex, small and delicate structures such as PCBs, ICs, electronic equipment and the like. The coating is particularly useful on relatively small assemblies bearing many parts or components, for example PCB assemblies used as part of larger electronic equipment.

To further illustrate the invention, an example actually using the coating material is now presented.

EXAMPLE

We applied about 1.5 to about 2.0 g. of calcium eicosanylbenzyl sulfonate material in a mineral spirit solvent (most likely a mixture of hexane and heptane) and a propane carrier to a 2"×3" PCB bearing 85 components (including transistors, ICs, etc.) by dipping. The coating thickness averaged about 1.0 mil. The coating was permitted to cure for 10 minutes. The coated board was aged in an oven at 50° C. for 10 minutes. Despite immersion in water for 1 hour, the circuit remained undamaged and completely operational. After use for 42 days in a 85% humidity/85° C. environment, no corrosion was observed.

The coating was selectively removed in a simulated repair operation by applying 10 mls of Freon halocarbon degreaser solvent to the coating over the position of the IC selected for replacement. The portion of the coating became soft and soluble, and was removed by simply rinsing it off. The IC component was removed by spot heating of the surface solder bonds and lifting the IC from its position on the PCB. A new IC was surface soldered into place. After cooling, the new IC and the opening in the coating were patched by an application of 0.1 g. of the same material. Upon curing of the coating material, the patched area appeared uniform. The circuit remained was found to be completely operational after replacement of the component. Further, after immersion in water for 1 hour, the repaired PCB continued to function as designed, even though the conformal coating had been patched.

It will be appreciated that modifications may be made in the exact implementation of the invention illustrated in the above examples which would still fall within the spirit and scope of the invention as claimed herein. For example, it is anticipated that the conformal coating blend may comprise a particular metal alkyl benzyl sulfonate, carrier and solvent combination not specifically mentioned but nonetheless encompassed and anticipated by the appended claims. Similarly, a particular solvent beyond those explicitly mentioned might be discovered or employed which is nonetheless anticipated.

We claim:

1. A coated electronic device comprising:
an electronic device having a plurality of components, at least one of the components having solderable connections; and
a water resistant coating over the electronic device covering the plurality of components in a conformal fashion, the water resistant coating being repairable and capable of being selectively removed with a degreaser solvent to uncover at least one of the components, and capable of being directly soldered through to provide access to one or more of the solderable connections, said water resistant coating consisting essentially of:
a blend of a metal alkyl benzyl sulfonate having the formula:

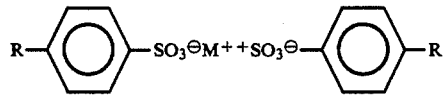

where M is Ca, Ba, Mg, Be or Mo, and R is an alkyl group of from 10 to 24 carbon atoms; and
an oxidized hydrocarbon carrier having from about 10 to about 20 carbon atoms and having at least one alkoxy substituent.

2. The coated electronic device of claim 1, further comprising an aliphatic hydrocarbon solvent selected from the group consisting of aliphatic hydrocarbon solvents having from about 3 to about 8 carbon atoms and having a boiling point below about 80° C.

3. The coated electronic device of claim 1 where the metal alkyl benzyl sulfonate of the water resistant coating has the formula:

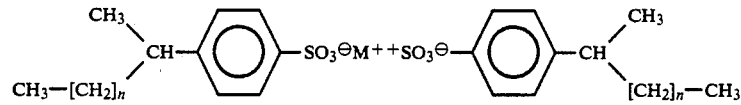

where n ranges from 10 to 20.

4. The coated electronic device of claim 1, where the degreaser solvent is selected from the group consisting of non-polar organic solvents consisting of mineral spirits, terpenes, naphtha, trichlorotrifluoroethane, methylene chloride, trichloroethane, xylene, hexane and mixtures thereof.

5. The coated electronic device of claim 1 where the electronic device is a printed circuit board (PCB).

6. A coated electronic device comprising:
an electronic device having a plurality of components, at least one of the components having solderable connections; and
a water resistant coating over the electronic device covering the plurality of components in a conformal fashion, the water resistant coating being repairable and capable of being selectively removed with a degreaser solvent selected from the group of non-polar organic solvents consisting of mineral spirits, terpenes, naphtha, trichlorotrifluoroethane, methylene chloride, trichloroethane, xylene, hexane and mixtures thereof to uncover at least one of the components, and capable of being directly soldered through to provide access to one or more of the solderable connections, said water resistant coating consisting of:
a blend of a metal alkyl benzyl sulfonate having the formula:

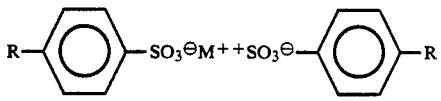

where M is Ca, Ba, Mg, Be or Mo, and R is an alkyl group of from 10 to 24 carbon atoms;
an oxidized hydrocarbon carrier having from about 10 to about 20 carbon atoms and having at least one alkoxy substituent; and
an aliphatic hydrocarbon solvent.

7. The coated electronic device of claim 6, where the aliphatic hydrocarbon solvent is selected from the group consisting of aliphatic hydrocarbon solvents having from about 3 to about 8 carbon atoms and having a boiling point below about 80° C.

8. The coated electronic device of claim 6 where the metal alkyl benzyl sulfonate of the water resistant coating has the formula:

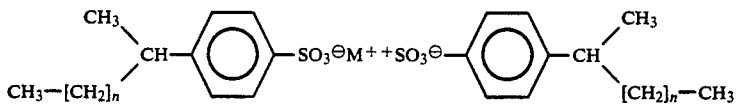

where n ranges from 10 to 20.

9. The coated electronic device of claim 6 where the electronic device is a printed circuit board (PCB).

10. A coated printed circuit board (PCB) comprising:
a PCB having a plurality of components; and
a water resistant coating over the PCB covering at least some of the plurality of components in a conformal fashion, where the water resistant coating consisting essentially of:
a metal alkyl benzyl sulfonate having the formula:

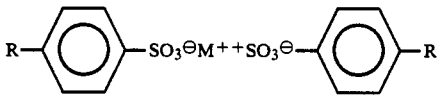

where M is Ca, Ba, Mg, Be or Mo, and R is an alkyl group of from 10 to 24 carbon atoms; and
an oxidized hydrocarbon carrier having from about 10 to about 20 carbon atoms and having at least one alkoxy substituent;
where the water resistant coating is repairable and capable of being selectively removed by a degreaser solvent selected from the group of non-polar organic solvents consisting of mineral spirits, terpenes, naphtha, trichlorofluoroethane, methylene chloride, trichloroethane, xylene, hexane and mixtures thereof to uncover at least one of the components, and capable of being directly soldered through to provide access to one or more of the components.

11. A process for protecting an electronic device from physical contact and contact with water, comprising the steps of:
providing an electronic device having a plurality of components thereon;
applying a conformal, water resistant and repairable coating over the electronic device covering the plurality of components, where the water resistant coating may be selectively removed with a degreaser solvent to uncover at least one of the components, and the coating is capable of being directly soldered through to provide access to one or more of the components, said water resistant coating consisting essentially of:
a blend of a metal alkyl benzyl sulfonate having the formula:

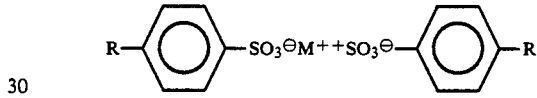

where M is Ca, Ba, Mg, Be or Mo, and R is an alkyl group of from 10 to 24 carbon atoms; and
an oxidized hydrocarbon carrier having from about 10 to about 20 carbon atoms and having at least one alkoxy substituent.

12. The process of claim 11, where the degreaser solvent is selected from the group of non-polar organic solvents consisting of mineral spirits, terpenes, naphtha, methylene chloride, trichlorotrifluoroethane, trichloroethane, xylene, hexane and mixtures thereof.

13. The process of claim 11, where the step of applying a conformal, water resistant coating over the electronic device is accomplished by a procedure selected from the group consisting of spraying, dipping, painting, curtain coating, brushing, foaming and combinations thereof.

14. The process of claim 11, further comprising the steps of: selectively removing the water resistant coating by means of a suitable solvent in order to expose one or more of the components; repairing the one or more exposed components; and re-applying additional water resistant coating over the exposed components.

15. The process of claim 11, further comprising the step of: repairing at least one of the components by soldering directly through the water resistant coating without prior removal of the coating.

16. The process of claim 15, further comprising the step of: re-applying additional water resistant coating over the repaired components.

* * * * *